United States Patent
Li et al.

(10) Patent No.: US 9,218,957 B2
(45) Date of Patent: Dec. 22, 2015

(54) THIN FILM TRANSISTOR AND MANUFACTURING METHOD THEREOF AND DISPLAY DEVICE

(71) Applicant: BOE TECHNOLOGY GROUP CO., LTD., Beijing (CN)

(72) Inventors: Yanzhao Li, Beijing (CN); Gang Wang, Beijing (CN); Li Sun, Beijing (CN); Shuang Guan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/703,537

(22) PCT Filed: Sep. 19, 2012

(86) PCT No.: PCT/CN2012/081614
§ 371 (c)(1),
(2) Date: Dec. 11, 2012

(87) PCT Pub. No.: WO2013/067855
PCT Pub. Date: May 16, 2013

(65) Prior Publication Data
US 2014/0124787 A1    May 8, 2014

(30) Foreign Application Priority Data
Nov. 11, 2011 (CN) .......................... 2011 1 0359315

(51) Int. Cl.
*H01L 21/265* (2006.01)
*H01L 27/12* (2006.01)
(Continued)

(52) U.S. Cl.
CPC .... *H01L 21/02238* (2013.01); *H01L 21/28158* (2013.01); *H01L 27/1222* (2013.01); *H01L 29/4908* (2013.01); *H01L 29/66757* (2013.01); *H01L 29/78675* (2013.01)

(58) Field of Classification Search
CPC .......................... H01L 21/324; H01L 21/02238
USPC ........... 438/480, 522, 762, 798; 257/347, 636
See application file for complete search history.

(56) References Cited

U.S. PATENT DOCUMENTS 5,943,602 A * 8/1999 Thakur .......................... 438/775
6,821,854 B2 * 11/2004 Kanda et al. ................... 438/275
(Continued)

FOREIGN PATENT DOCUMENTS

CN    1188243 A    7/1998
CN    1713389 A    12/2005
(Continued)

OTHER PUBLICATIONS

Korean Examination Opinion dated Jun. 26, 2014; Appln. No. 10-2014-7014697.
(Continued)

*Primary Examiner* — Calvin Lee
(74) *Attorney, Agent, or Firm* — Ladas & Parry LLP

(57) ABSTRACT

Embodiments of the present invention provide a thin film transistor, a manufacturing method thereof and a display device. The method for manufacturing the thin film transistor, comprising the following steps: providing a substrate; forming a semiconductor layer on the substrate; forming a gate insulating layer; and forming a gate electrode, wherein the gate insulating layer comprises a first gate insulating layer, the first gate insulating layer being formed by oxidizing a portion of the semiconductor layer, and the unoxidized portion of the semiconductor layer forming an active layer, and wherein the gate electrode is formed in such a way that the gate insulating layer is sandwiched between the gate electrode and the active layer.

12 Claims, 2 Drawing Sheets

(51) Int. Cl.
*H01L 21/02* (2006.01)
*H01L 29/49* (2006.01)
*H01L 29/66* (2006.01)
*H01L 29/786* (2006.01)
*H01L 21/28* (2006.01)

(56) References Cited

U.S. PATENT DOCUMENTS

| 2002/0113264 | A1 | 8/2002 | Horikoshi et al. |
| 2003/0034940 | A1 | 2/2003 | Yamazaki et al. |
| 2005/0020000 | A1* | 1/2005 | Yudasaka ............... 438/199 |
| 2005/0285180 | A1 | 12/2005 | Mitani et al. |
| 2008/0265323 | A1 | 10/2008 | Miyairi |
| 2011/0114961 | A1 | 5/2011 | Lee et al. |
| 2014/0124787 | A1 | 5/2014 | Li et al. |

FOREIGN PATENT DOCUMENTS

| CN | 102646595 A | 8/2012 |
| JP | 60-093508 A | 5/1985 |
| JP | 2749687 B2 | 5/1998 |
| JP | 4006993 B2 | 11/2007 |
| JP | 2008-159640 A | 7/2008 |
| KR | 20020068252 A | 8/2002 |
| KR | 20050007126 A | 1/2005 |
| KR | 10-0516311 B1 | 9/2005 |
| KR | 20070009526 A | 1/2007 |

OTHER PUBLICATIONS

Korean Office Action dated Jun. 26, 2014; Appln. No. 10-2012-7030806.
Second Chinese Office Action, Appln. No. 2011103593151; Dated Aug. 29, 2014.
Shigeichi Yamamoto, et al; "Silicon Surface Nitrification Using Hydrogen and Ammonia by Hybrid Excitation", Electronics and Communications in Japan (Part II: Electronics); vol. 76, Issue 3, pp. 74-84, Mar. 1993.
Korean Examination Opinion dated Dec. 24, 2014; Appln. No. 10-2014-7014697.
Koraen Examination Opinion dated Jan. 23, 2015; Appln. No. 10-2012-7030806.
Extended European Search Report dated May 3, 2015; Appln. No./Patent No. 12778033.6-1504/2613346 PCT/CN2012081614.
Third Chinese Office Action dated Feb. 10, 2015; Appln. No. 201110359315.1.
Korean Office Action dated Oct. 25, 2013; Appln. No. 10-2012-7030806.
Chinese Office Action dated Jan. 6, 2014; Appln. No. 201110359315.1.
International Preliminary Report on Patentability dated May 13, 2014; PCT/CN2012/081614.
International Search Report mailed Mar. 1, 2013; PCT/CN2012/081614.
Korean Notice of Allowance dated May 18, 2015; Appln. No. 10-2014-7014697.
Chinese Rejection Decision dated Jul. 15, 2015; Appln. No. 201110359315.1.

* cited by examiner

THIN FILM TRANSISTOR AND MANUFACTURING METHOD THEREOF AND DISPLAY DEVICE

CROSS REFERENCE TO RELATED APPLICATIONS

This application is a national stage application under 35 U.S.C. 371 and claims the benefit of PCT Application No. PCT/CN2012/081614 having an international filing date of Sep. 19, 2012, which designated the United States, which PCT application claimed the benefit of Chinese Application No. 201110359315.1 filed Nov. 11, 2011, the disclosure of each of which are incorporated herein by reference.

FIELD OF THE INVENTION

Embodiments of the present invention relate to a thin film transistor (TFT), a manufacturing method thereof and a display device.

BACKGROUND OF THE INVENTION

Thin Film Transistors (TFTs) have been used in a variety of electro-optical devices, such as liquid crystal display devices and semiconductor devices. In a TFT, the quality of a gate insulating layer has an extremely important effect on the electrical properties of the TFT. Using a gate insulating material with a high-quality and a high K-value (i.e., dielectric constant) can improve the device performances of a TFT to a large extent, for example, it can lower a threshold voltage, increase a $I_{on}/I_{off}$ ratio and decrease a sub-threshold swing.

Conventional TFT devices use processes such as chemical vapor deposition (CVD) and sputtering to deposit a $SiO_2$ or $SiN_x$ film as a gate insulating layer. For example, a non-patent document 1 discloses a method for preparing a gate insulating layer with a process of using tetraethyl orthosilicate (TEOS). However, this method is still a CVD process, and the formed gate insulating thin layer has a relatively loosen texture and an unsatisfactory insulating property (only achieving approximately $5.6 \times 10^6$ V·cm$^{-1}$) due to a relatively low formation temperature, which will affect the device performances due to a too large leakage current for the TFT device. If the gate insulating layer is thickened, the operating voltage of the device may be increased, and the process time may be extended.

Therefore, there is still a need in the art for an improved method for manufacturing a TFT, especially a gate insulating layer.

Non-Patent Document 1: Kow-Ming Chang, et al., "Electrical Characteristics of Low Temperature Polysilicon TFT With a Novel TEOS/Oxynitride Stack Gate Dielectric", IEEE ELECTRON DEVICE LETTERS, Vol. 24, No. 8, August 2003.

SUMMARY OF THE INVENTION

An embodiment of the present invention provides a method for manufacturing a thin film transistor, the method comprising the following steps: providing a substrate; forming a semiconductor layer on the substrate; forming a gate insulating layer; and forming a gate electrode, wherein the gate insulating layer comprises a first gate insulating layer, the first gate insulating layer being formed by oxidizing a portion of the semiconductor layer, and the unoxidized portion of the semiconductor layer forming an active layer, and wherein the gate electrode is formed in such a way that the gate insulating layer is sandwiched between the gate electrode and the active layer.

Another embodiment of the present invention provides a thin film transistor, comprising: a substrate, an active layer, a gate insulating layer, a gate electrode and source/drain electrodes, wherein the gate insulating layer comprises a first gate insulating layer in direct contact with the active layer, and the first gate insulating layer has a dielectric intensity of at least $8 \times 10^6$ V·cm$^{-1}$.

Still another embodiment of the present invention provides a display device, the display device comprising a thin film transistor in accordance with any embodiment of the present invention.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 6:
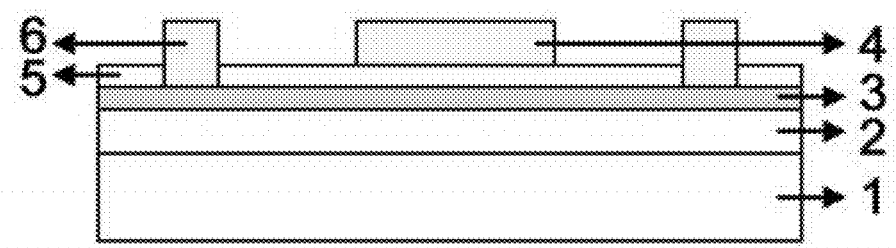
FIG. 6 shows a schematic illustration of a structure of a TFT device according to an example of the present invention.

First of all, with reference to FIG. 6, a structure of a TFT device will be described. Specifically, the TFT device comprises a substrate 1, an active layer 3, a first gate insulating layer 5 located above the active layer 3, a gate electrode 4 located above the first gate insulating layer 5, and source/drain electrodes 6 in contact with the active layer 3 through openings in the first gate insulating layer 5. The first gate insulating layer 5 is in direct contact with the active layer 3. The TFT device 101 may further comprise a buffer layer 2 between the active layer 3 and the substrate 1. The buffer layer 2 may have a thickness of 5-1000 nm, and is formed of $SiO_2$ or $SiN_x$. The substrate 1 may be a transparent glass, and the substrate 1 may have a thickness of 30-1000 μm. However, the substrate 1 is not limited to the transparent glass, and may be other transparent or opaque substrates; moreover, the thickness of the substrate 1 is not limited to the thickness described above, either.

Preferably, the active layer 3 is formed of polysilicon. The polysilicon may use the amorphous silicon obtained by an excimer laser annealing (ELA) process. For example, on the transparent substrate 1 deposited with a buffer layer 2 thereon, amorphous silicon with a thickness of 50-200 nm is firstly deposited, and then the amorphous silicon layer is crystallized by using an equipment such as an ELA with a high energy (e.g., approximately 100-500 mJ·cm$^{-2}$) to scan it, thereby converting it into a polysilicon layer.

In a preferred example, a semiconductor layer 3' (e.g., a polysilicon layer, refer to FIG. 3) used for forming the active layer 3 may be placed in an oxidizing atmosphere (e.g., a nitrogen-containing or oxygen-containing atmosphere), and heated by means of convection heating or laser heating or the like, so that a surface of the semiconductor layer 3' directly forms a dense thermal-oxidized gate insulating layer 5. For example, in an oxygen-containing environment, by heating a semiconductor layer 3' (e.g., a polysilicon layer) used for forming the active layer 3, a dense thermal-oxidized gate insulating layer 5 (a thermal silicon oxide layer) can be directly formed. The gate insulating layer 5 may have a thickness of 1-100 nm. At this time, the surface layer of the semiconductor layer is oxidized to form a dense thermal-oxidized gate insulating layer 5; while the unoxidized portion in the semiconductor layer forms the active layer 3 (refer to FIG. 4).

In another example, an additional second gate insulating layer may be further formed on the gate insulating layer 5 by other methods (e.g., a CVD method or a sputtering method), thereby forming a composite gate insulating layer (not shown in the figure). The composite gate insulating layer may have a total thickness (i.e. the sum of the thicknesses of the first gate insulating layer and the second gate insulating layer) of 1-100 nm. At this time, the second gate insulating layer is located between the gate electrode 4 and the first gate insulating layer 5, and the source/drain electrodes 6 are in contact with the active layer 3 through openings in the composite gate insulating layer.

The gate electrode 4 may be formed above the gate insulating layer (in a top-gate structure) which is composed of the first gate insulating layer 5 or composed of the composite gate insulating layer described above. Alternatively, in a TFT with a bottom-gate structure, the gate electrode 4 may be formed on the substrate 1.

In one embodiment, the technical solution according to the embodiment of the present invention can be applied to a bottom-gate structure. In this case, the gate electrode 4 is provided over the substrate 1 (or the buffer layer 2), and the gate insulating layer is provided above the gate electrode 4. In this case, a gate electrode 4 may be formed at first, and then a semiconductor layer is formed above the gate electrode 4; next, the bottom of the semiconductor layer is formed into an insulating layer by implanting oxygen element to the bottom of the semiconductor layer. The insulating layer can be used as a gate insulating layer, while the unoxidized upper portion is used as an active layer. Certainly, in addition to the oxygen element implanted in the semiconductor layer used for oxidation as described above, other elements which have an oxidizing effect may also be used.

The gate electrode 4 has a thickness of 1-200 nm, and may be selected from materials of metals such as Mo, Cr, Au, and other alloys. The gate electrode 4 may be formed by patterning a metal gate layer. The source/drain electrodes 6 have a thickness of 5-300 nm, and may be selected from materials of metals such as Mo, Al, In, Ti, composite metals and alloys. The source/drain electrodes 6 may be formed by patterning the source/drain metal layer.

Figure 1:
FIG. 1 shows a schematic illustration of a substrate used in a manufacturing process of a TFT device according to an example of the present invention.
Figure 2:
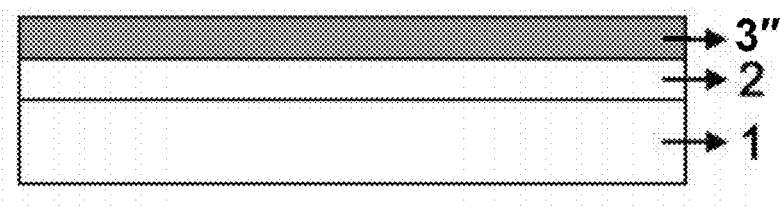
FIG. 2 shows a schematic illustration of a structure formed in a manufacturing process of a TFT device according to an example of the present invention.
Figure 3:
FIG. 3 shows a schematic illustration of a structure formed in a manufacturing process of a TFT device according to an example of the present invention.

Hereinafter, with reference to FIGS. 1-6, a manufacturing process of a TFT device according to an example of the present invention will be described. FIG. 1 shows a transparent substrate 1 used in the manufacturing process of the TFT device according to an example of the present invention. The transparent substrate 1 may be cleaned according to a standard process, and then a buffer layer 2 and a semiconductor layer 3' are sequentially formed. For example, the semiconductor 3' may be formed by a method as follows: firstly, a semiconductor layer precursor 3" (e.g., amorphous silicon) is formed, thereby obtaining a structure as shown in FIG. 2; next, the semiconductor layer precursor 3" shown in FIG. 2 may be converted into a semiconductor layer 3' used for forming an active layer 3, thereby obtaining a structure as shown in FIG. 3. For example, in a vacuum environment, an amorphous silicon thin film is crystallized by means of laser crystallization or the like, and thus a polysilicon layer 3' is formed. It should be noted that, the method for forming the semiconductor layer 3' is not limited to the above-described method which forms a polysilicon layer by crystallizing amorphous silicon through a laser crystallization process.

Figure 4:
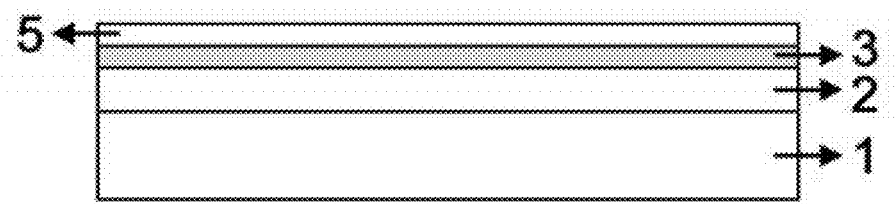
FIG. 4 shows a schematic illustration of a structure formed in a manufacturing process of a TFT device according to an example of the present invention.

FIG. 4 shows a schematic illustration of a structure obtained by forming a gate insulating layer 5 on a structure shown in FIG. 3. As an example, a surface of the semiconductor layer 3' (e.g., a polysilicon layer) may be treated with a 1% hydrofluoric acid (HF) at first, and then in an oxidizing atmosphere, the surface layer of the semiconductor layer 3' is thermal-oxidized into a dense gate insulating layer 5. Meanwhile, an unoxidized portion (the lower portion) in the semiconductor layer 3' forms an active layer 3.

The thermal oxidation may adopt a dry-thermal oxidation process or a wet-thermal oxidation process, and provides energy for the oxidation process by means of using an annealing furnace or ELA. Preferably, in an atmosphere used in a dry-thermal oxidation process, the oxygen content in volume is greater than 98%, and the water content in volume is less than 10 ppm. In an atmosphere used in a wet-thermal oxidation process, the oxygen content in volume is greater than 97%, and the water content in volume is 10-1000 ppm. An atmosphere for a wet-thermal oxidation process may be obtained by the following way: when oxygen goes through an annealing furnace, the oxygen is subjected to going through a container (e.g., a conical flask) or the like which contains deionized water, thereby the oxygen is naturally mixed with water vapor as it goes through the deionized water. At this time, the water content in volume is preferably 10-1000 ppm.

The skilled in the art will understand that, the oxidizing atmosphere not only comprises an oxygen-containing atmosphere, but also may comprise an atmosphere containing other oxidizing substances, for example a nitrogen-containing atmosphere. For example, a nitrogen-containing atmosphere may be an atmosphere containing $N_2$ or $NH_3$. Therefore, at this time, if the semiconductor layer 3' is polysilicon, then the resultant gate insulating layer 5 is made of $SiN_x$.

In one example, another gate insulating layer may be deposited on the first gate insulating layer 5 by a conventional method (for example, CVD or a sputtering method). For example, in the case that the gate insulating layer 5 is made of $SiO_2$, the method according to the embodiment of the present invention further comprises: combing the thermal-oxidized $SiO_2$ and $SiO_2$ formed by other methods to form a gate insulating layer.

Figure 5:
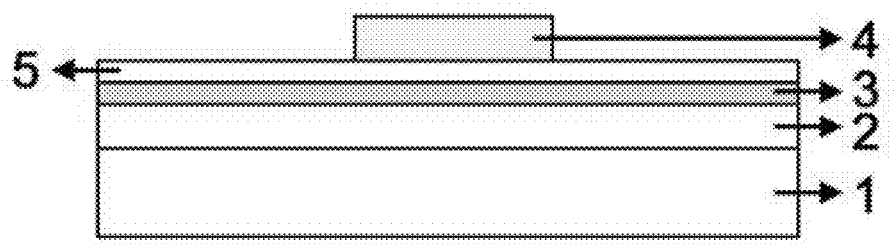
FIG. 5 shows a schematic illustration of a structure formed in a manufacturing process of a TFT device according to an example of the present invention.

As shown in FIG. 5, next, a gate metal layer may be deposited, and a desired pattern is formed by means of photolithography or the like, so as to form a gate electrode 4. Then, by photolithography and etching processes, openings (contact holes) required for the contact between source/drain electrodes 6 and an active layer are etched out, and then a source/drain metal layer is deposited, and a desired pattern is formed by means of a photolithography process to form the source/drain electrodes 6, thereby obtaining the TFT device as shown in FIG. 6. At this time, the source/drain electrodes 6 are in contact with the active layer through the openings in the gate insulating layer 5. In the process of forming a composite gate insulating layer as described above, the source/drain electrodes 6 are in contact with the active layer through openings in the composite gate insulating layer. At the end, the resultant structure is tested and analyzed.

It should be understood that, the above only describes the manufacturing process of a TFT device having a top-gate structure, with reference to FIGS. 1-6. The method according to the embodiment of the invention can also be applicable to a TFT device having such as a bottom-gate structure.

Hereinafter, embodiments of the present invention will be further described in conjunction with specific examples, but the present invention is not limited to the following examples.

A Comparative Example

Manufacturing of a SiO$_2$ Gate Insulating Layer by a CVD Method

Firstly, a quartz substrate is cleaned, and on the substrate, by using a CVD method, a 50 nm thickness of SiN$_x$ and a 300 nm thickness of SiO$_2$ are sequentially deposited as a buffer layer; then, a 100 nm thickness of amorphous silicon is deposited, and with the use of excimer laser, the amorphous silicon is subject to a crystallization process; thereafter, the sample is subject to a surface treatment with a 1% (in volume) HF; and then on the surface of the sample, by using a CVD method, a 50 nm thickness of SiO$_2$ thin film is deposited, and next, a Mo gate electrode and Mo/Al source/drain electrodes are sequentially formed thereon.

The SiO$_2$ thin film formed by this method is relatively loose, and has an ordinary gate insulating property, with a density of 1.9-2.3 g·cm$^{-3}$, a refractive index of 1.43-1.45, and a dielectric intensity of approximately 5.6×10$^6$ V·cm$^{-1}$. The method can be applicable on ordinary glasses, and the deposition time of the SiO$_2$ thin film is about 1-10 minutes.

First Embodiment

Formation of a Gate Insulating Layer by Using an Annealing Furnace with a Dry-Thermal Oxidation Process Firstly, a quartz substrate is cleaned, and on the substrate, by using a CVD method, a 50 nm thickness of SiN$_x$ and a 300 nm thickness of SiO$_2$ are sequentially deposited as a buffer layer; then, a 100 nm thickness of amorphous silicon is deposited, and with the use of excimer laser, the amorphous silicon is subject to a crystallization process; thereafter, the sample is subject to a surface treatment with a 1% (in volume) HF; and then the sample is placed in an annealing furnace in a pure dry oxygen atmosphere (with an oxygen content in volume greater than 98%, and a water content in volume less than 10 ppm); the annealing temperature is raised to 1000° C. for oxidizing for 20 minutes, thereby forming a dense SiO$_2$ thin film with a thickness of about 50 nm; and next, a Mo gate electrode and Mo/Al source/drain electrodes are sequentially deposited thereon.

The SiO$_2$ thin film formed by this method is densest, and has a best gate insulating property, with a density of 2.0-2.4 g·cm$^{-3}$, a refractive index of 1.45-1.47, and a dielectric intensity of greater than 10×10$^6$ V·cm$^{-1}$. The method can be applicable on high temperature resistant glass, and the deposition time of the SiO$_2$ thin film is longer than 20 minutes.

Second Embodiment

Formation of a Gate Insulating Layer by Means of Laser Heating

Firstly, a glass substrate is cleaned, and on the substrate, by using a CVD method, a 100 nm thickness of SiN$_x$ and a 200 nm thickness of SiO$_2$ are sequentially deposited as a buffer layer; then, a 100 nm thickness of amorphous silicon is deposited, and with the use of excimer laser, the amorphous silicon is subject to a crystallization process; thereafter, the sample is subject to a surface treatment with a 1% (in volume) HF; and then the sample is placed in a pure dry oxygen atmosphere (with an oxygen content in volume greater than 98%, and a water content in volume less than 10 ppm), and again by using near-infrared excimer laser with high energy density (100-500 mJ·cm$^{-2}$) for scanning, a dense SiO$_2$ thin film with about 30 nm thickness is formed; and next, a Mo gate electrode and Mo/Al source/drain electrodes are sequentially deposited thereon.

The SiO$_2$ thin film formed by this method is dense, and has a good gate insulating property, with a density of 2.0-2.4 g·cm$^{-3}$, a refractive index of 1.45-1.47, and a dielectric intensity of 9×10$^6$ V·cm$^{-1}$. The method can be applicable on ordinary high temperature glass, and the growth time of the SiO$_2$ thin film is about 30-60 minutes (for a sample of 370 mm×470 mm).

Third Embodiment

Manufacturing of a Composite Gate Insulating Thin Film

Firstly, a glass substrate is cleaned, and on the substrate, by using a CVD method, a 200 nm thickness of SiN$_x$ and a 200 nm thickness of SiO$_2$ are sequentially deposited as a buffer layer; then, a 100 nm thickness of amorphous silicon is deposited, and with the use of excimer laser, the amorphous silicon is subject to a crystallization process; thereafter, the sample is subject to a surface treatment with a 1% (in volume) HF; and then the sample is placed in an annealing furnace in an atmosphere containing 1000 ppm oxygen, the annealing temperature is raised to 400° C. for oxidizing for 100 seconds, thereby forming an about 5-10 nm thickness of a SiO$_2$ thin film. Next, by using a CVD method, a 40 nm thickness of SiO$_2$ is deposited thereon, and finally a Mo gate electrode and Mo/Al source/drain electrodes are sequentially formed.

In this method, the growth time of the SiO$_2$ thin film is as follows: the thermal oxidation time is about 60-300 seconds, thereafter the growth time of the CVD method is about 60-300 seconds, thus the total time is about 2-10 minutes; the 5-10 nm thickness of SiO$_2$ thin film near a contact surface between the active layer and the gate insulating layer is relatively dense and has a very good insulating property. The thermal-oxidized film layer has: a density of 2.0-2.4 g·cm$^{-3}$, a refractive index of 1.45-1.47, and a dielectric intensity of approximately 10×10$^6$ V·cm$^{-1}$; the CVD deposited film layer has a density of 2.0-2.2 g·cm$^{-3}$, a refractive index of 1.43-1.45, and a dielectric intensity of approximately 6×10$^6$ V·cm$^{-1}$. Thus, the quality of the contact interface between the active layer and the gate insulating layer can be ensured, and the process can be applicable on ordinary glass.

Fourth Embodiment

Formation of a Gate Insulating Film Made of $SiN_x$

Firstly, a quartz substrate is cleaned, and on the substrate, by using a CVD method, a 50 nm thickness of $SiN_x$ and a 300 nm thickness of $SiO_2$ are sequentially deposited as a buffer layer; then, a 100 nm thickness of amorphous silicon is deposited, and with the use of excimer laser, the amorphous silicon is subject to a crystallization process; thereafter, the sample is subject to a surface treatment with a 1% (in volume) HF; and then in an atmosphere containing $NH_3$, with the use of an ELA process (with an energy density of approximately 100-500 $mJ·cm^{-2}$), a 50 nm thickness of $SiN_x$ thin film is grown; and next, a Mo gate electrode and Mo/Al source/drain electrodes are sequentially deposited thereon.

The $SiN_x$ thin film formed by this method is relatively dense and has a relatively good insulating property, with a density of 3.2-3.5 $g·cm^{-3}$, a refractive index of 1.43-1.45, and a dielectric intensity greater than $1\times10^7$ $V·cm^{-1}$. This method can be adapted to an ordinary glass, and the deposition time of the thin film is about 10-30 minutes.

Further, the embodiments of the present invention are not limited to the above examples. For example, although the above describes that both the source/drain electrodes 6 and the gate electrode 4 are provided above the active layer 3, the embodiments of the present invention, however, are not limited to this structure. It is also possible that, the source/drain electrodes 6 are provided below the active layer 3 while the gate electrode 4 is provided above the active layer. At this time, before the formation of a semiconductor layer precursor 3" used for the active layer 3, source/drain electrodes 6 are need to be formed on the substrate. After an active layer 3 is formed above the source/drain electrodes 6, the active layer 3 may be in contact with the source/drain electrodes 6. At this point, the process of forming a contact hole in the gate insulating layer for contact between the source/drain electrodes 6 and the active layer 3 can be omitted.

According to the embodiments of the present invention, it is possible to form a dense gate insulating layer, and reduce the thickness of the gate insulating layer and the process time, while improving the electrical properties of the TFT device by reducing its leakage current. Therefore, on the one hand, the present invention inhibits the influence of a surface state between an active layer and a gate insulating layer; on the other hand, a dense gate insulating layer facilitates in reducing a leakage current of a TFT device.

According to the above-described embodiments of the present invention, at least the following methods or configurations can be provided.

(1) A method for manufacturing a thin film transistor, comprising the following steps:
  providing a substrate;
  forming a semiconductor layer on the substrate;
  forming a gate insulating layer; and
  forming a gate electrode,
wherein the gate insulating layer comprises a first gate insulating layer, the first gate insulating layer being formed by oxidizing a portion of the semiconductor layer, and the unoxidized portion of the semiconductor layer forming an active layer, and
wherein the gate electrode is formed in such a way that the gate insulating layer is sandwiched between the gate electrode and the active layer.

(2) The method according to (1), wherein oxidizing the portion of the semiconductor layer comprises:
  heating the semiconductor layer in an oxidizing atmosphere.

(3) The method according to (1) or (2), wherein after the formation of the gate electrode, openings are formed in the gate insulating layer at both sides of the gate electrode to expose the active layer, and source/drain electrodes are formed at the locations of the openings so as to contact with the active layer.

(4) The method according to (1) or (2), wherein source/drain electrodes are formed before the formation of the semiconductor layer, and the semiconductor layer is formed over and in contact with the source/drain electrodes.

(5) The method according to any one of (2)-(4), wherein the temperature for heating the semiconductor layer is in a range of 300° C. to 1200° C.

(6) The method according to any one of (1)-(5), wherein the semiconductor layer is a polysilicon layer.

(7) The method according to (6), wherein the first gate insulating layer is formed by heating the polysilicon layer in an oxygen-containing atmosphere to generate $SiO_2$ at a surface of the polysilicon layer.

(8) The method according to (7), wherein the oxidizing atmosphere has an oxygen content in volume of greater than 98%, and a water content in volume of less than 10 ppm; alternatively, the oxidizing atmosphere has an oxygen content in volume of greater than 97%, and a water content in volume of 10-1000 ppm.

(9) The method according to (6), wherein the first gate insulating layer is formed by heating the polysilicon layer in a nitrogen-containing atmosphere to generate $SiN_x$ at a surface of the polysilicon layer.

(10) The method according to (9), wherein the nitrogen-containing atmosphere contains $N_2$ or $NH_3$.

(11) The method according to any one of (1)-(10), wherein forming the gate insulating layer further comprises: forming a second gate insulating layer on the first gate insulating layer by a chemical vapor deposition method or a sputtering method.

(12) The method according to any one of (1)-(11),
wherein before the formation of the semiconductor layer, a buffer layer is formed on the substrate, and
wherein the semiconductor layer is formed by forming an amorphous silicon layer on the buffer layer and crystallizing the amorphous silicon layer into a polysilicon layer with the use of an excimer laser method.

(13) A thin film transistor, comprising: a substrate, an active layer, a gate insulating layer, a gate electrode and source/drain electrodes, wherein the gate insulating layer comprises a first gate insulating layer in direct contact with the active layer, and the first gate insulating layer has a dielectric intensity of at least $9\times10^6$ $V·cm^{-1}$.

(14) The thin film transistor according to (13), wherein the first gate insulating layer is formed by heating a semiconductor layer used for forming the active layer in an oxidizing atmosphere, the semiconductor layer being a polysilicon layer.

(15) The thin film transistor according to any one of (13)-(14), wherein the gate insulating layer further comprises a second gate insulating layer on the first gate insulating layer, the second gate insulating layer being formed through a chemical vapor deposition method or a sputtering method.

(16) A display device, comprising a thin film transistor in accordance with any one of (13)-(15).

Further, in the item (1) described above, the step of oxidizing a semiconductor is not limited to a process of heating in an oxidizing atmosphere as described above, but may adopt any suitable oxidation method. For example, it is also possible to oxidize a portion of a semiconductor layer by implanting elements with an oxidizing property (e.g., an oxygen element or a nitrogen element). In this case, the position of an oxidized portion can be controlled, for example, a portion at the bottom of the semiconductor layer can be oxidized.

It should be noted that, in the above-described structure of a TFT, the position relationship and connection relationship among various parts can be adjusted at will according to the prior art. For example, both the gate electrode and the source/drain electrodes may be provided above a gate insulating layer, and the source/drain electrodes are in contact with an active layer through openings in the gate insulating layer; alternatively, the gate electrode may be provided above the gate insulating layer, whereas the source/drain electrodes are provided below the active layer so as to be in direct contact with the active layer. The gate electrode may be provided above the active layer, and also may be provided below the active layer, as long as they are spaced by the gate insulating layer provided therebetween. In addition, in one embodiment, the first gate insulating layer of a TFT may have a dielectric intensity of at least $9 \times 10^6$ V·cm$^{-1}$. In addition, preferably, the first gate insulating layer may have a mass density of 2.0-3.5 g·cm$^{-3}$.

TFTs according to embodiments of the present invention can be used in a display device such as a liquid crystal display. According to an embodiment of the present invention, there is further provided a display device, comprising: a thin film transistor in accordance with any embodiment of the present invention or a thin film transistor which is manufactured by a method in accordance with any embodiment of the present invention. As to other components of a display device, they are known to the skilled in the art. For example, these components include (but not limited to): a polarizing film, a common electrode, an alignment layer, sealant, liquid crystal, a spacer, a protective layer, an organic semiconductor active layer, anisotropic conductive adhesive film (ACF), a driver IC, a printed circuit board (PCB), a control IC, a black matrix (BM), and a color filter (CF).

It can be understood that, the above embodiments are merely exemplary implementations used for explaining the principle of the present invention; however, the present invention is not limited thereto. For those ordinary skilled in the art, modifications and improvements can be made without departing from the spirit and essence of the present invention, these modifications and improvements should be regarded as within the protection scope of the present invention.

What is claimed is:

1. A method for manufacturing a thin film transistor, comprising the following steps:
    providing a substrate;
    forming a semiconductor layer on the substrate, the semiconductor layer is a polysilicon layer;
    forming a gate insulating layer; and
    forming a gate electrode,
    wherein the gate insulating layer comprises a first gate insulating layer, the first gate insulating layer being formed by heating the polysilicon layer in a nitrogen-containing atmosphere to generate SiN$_x$ at a surface of the polysilicon layer, and the unnitridized portion of the semiconductor layer forming an active layer, and
    wherein the gate electrode is formed in such a way that the gate insulating layer is sandwiched between the gate electrode and the active layer.

2. The method according to claim 1, wherein after the formation of the gate electrode, openings are formed in the gate insulating layer at both sides of the gate electrode to expose the active layer, and source/drain electrodes are formed at the locations of the openings so as to contact with the active layer.

3. The method according to claim 1, wherein source/drain electrodes are formed before the formation of the semiconductor layer, and the semiconductor layer is formed over and in contact with the source/drain electrodes.

4. The method according to claim 1, wherein the temperature for heating the semiconductor layer is in a range of 300° C. to 1200° C.

5. The method according to claim 1, wherein forming the gate insulating layer further comprises: forming a second gate insulating layer on the first gate insulating layer by a chemical vapor deposition method or a sputtering method.

6. The method according to claim 1,
    wherein before the formation of the semiconductor layer, a buffer layer is formed on the substrate, and
    wherein the semiconductor layer is formed by forming an amorphous silicon layer on the buffer layer and crystallizing the amorphous silicon layer into a polysilicon layer with the use of an excimer laser method.

7. The method according to claim 1, wherein the first gate insulating layer is formed by heating the polysilicon layer in a nitrogen-containing atmosphere to generate SiN$_x$ at a surface of the polysilicon layer.

8. The method according to claim 7, wherein the nitrogen-containing atmosphere contains N$_2$ or NH$_3$.

9. A thin film transistor, comprising:
    a substrate;
    an active layer;
    a gate insulating layer;
    a gate electrode and source/drain electrodes,
    wherein the gate insulating layer comprises a first gate insulating layer in direct contact with the active layer, and the first gate insulating layer has a dielectric intensity of at least $9 \times 10^6$ V·cm$^{-1}$, the first gate insulating layer is formed by heating a semiconductor layer used for forming the active layer in a nitrogen-containing atmosphere, the semiconductor layer being a polysilicon layer.

10. The thin film transistor according to claim 9, wherein the gate insulating layer further comprises a second gate insulating layer on the first gate insulating layer, the second gate insulating layer being formed through a chemical vapor deposition method or a sputtering method.

11. A display device, comprising a thin film transistor,
    wherein the thin film transistor comprises: a substrate, an active layer, a gate insulating layer, a gate electrode and source/drain electrodes, and
    wherein the gate insulating layer comprises a first gate insulating layer in direct contact with the active layer, the first gate insulating layer is formed by heating a semiconductor layer used for forming the active layer in a nitrogen-containing atmosphere, the semiconductor layer being a polysilicon layer, and the first gate insulating layer has a dielectric intensity of at least $9 \times 10^6$ V·cm$^{-1}$.

12. The display device according to claim 11, wherein the gate insulating layer further comprises a second gate insulating layer on the first gate insulating layer, the second gate insulating layer being formed through a chemical vapor deposition method or a sputtering method.

* * * * *